United States Patent
Choi et al.

(10) Patent No.: US 9,793,009 B2
(45) Date of Patent: *Oct. 17, 2017

(54) REPAIR INFORMATION STORAGE CIRCUIT AND SEMICONDUCTOR APPARATUS INCLUDING THE SAME

(71) Applicant: SK hynix Inc., Icheon-si, Gyeonggi-do (KR)

(72) Inventors: Woong Kyu Choi, Icheon-si (KR); Jong Man Im, Icheon-si (KR); Jun Cheol Park, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/072,548

(22) Filed: Mar. 17, 2016

(65) Prior Publication Data

US 2016/0196881 A1 Jul. 7, 2016

Related U.S. Application Data

(63) Continuation of application No. 14/608,376, filed on Jan. 29, 2015, now Pat. No. 9,324,459.

(30) Foreign Application Priority Data

Dec. 5, 2014 (KR) ........................ 10-2014-0174410

(51) Int. Cl.
*G11C 17/16* (2006.01)
*G11C 29/00* (2006.01)
*G11C 17/18* (2006.01)
*G11C 29/44* (2006.01)

(52) U.S. Cl.
CPC .............. *G11C 29/78* (2013.01); *G11C 17/16* (2013.01); *G11C 17/18* (2013.01); *G11C 2029/4402* (2013.01)

(58) Field of Classification Search
CPC ......... G11C 17/16; G11C 17/18; G11C 29/78; G11C 2029/4402
See application file for complete search history.

(56) References Cited

U.S. PATENT DOCUMENTS

| | | |
|---|---|---|
| 6,603,689 B2 | 8/2003 | Kato et al. |
| 7,573,306 B2 | 8/2009 | Kumazaki et al. |
| 8,280,672 B2 | 10/2012 | Kim |
| 8,610,491 B2 | 12/2013 | You |

FOREIGN PATENT DOCUMENTS

KR 1020070077882 A 7/2007

*Primary Examiner* — Harry W Byrne
*Assistant Examiner* — R Lance Reidlinger
(74) *Attorney, Agent, or Firm* — William Park & Associates LTD.

(57) ABSTRACT

A repair information storage circuit may include a fuse block, a controller, and a fuse latch array. The fuse block provides a boot-up enable signal and repair information. The controller generates a voltage control signal in response to the boot-up enable signal. The fuse latch array stores repair information provided from the fuse block. The voltage control signal, which is used as a bulk bias of a transistor formed in the fuse latch array, is adjustable.

19 Claims, 4 Drawing Sheets

REPAIR INFORMATION STORAGE CIRCUIT AND SEMICONDUCTOR APPARATUS INCLUDING THE SAME

CROSS-REFERENCES TO RELATED APPLICATION

The present application is a Continuation of U.S. application Ser. No. 14/608,376, filed on Jan. 29, 2015, and the present application claims priority under 35 U.S.C. §119(a) to Korean application number 10-2014-0174410 filed on Dec. 5, 2014, in the Korean Intellectual Property Office, which is incorporated herein by reference in its entirety.

BACKGROUND

1. Technical Field

Embodiments of the present invention generally relate to an integrated circuit, and more particularly, in one or more embodiments, to a repair information storage circuit and a semiconductor apparatus including the same.

2. Related Art

A semiconductor apparatus may perform tests to find defects therein. Test equipments may also perform tests on the semiconductor apparatus. For example, tests may be performed on semiconductor memory apparatus to find defective memory cells by using internal test circuits and/or test equipments.

When a memory controller accesses a memory cell which is known as a defective memory cell, the memory controller may access a redundant memory cell (hereafter, referred to as a "redundant cell") allocated to the defective memory cell. This operation may be referred to as a repair operation.

Information for the repair operation such as the allocation of an address of the defective memory cell to an address of the redundant cell may be referred to as repair information, and the repair information may be stored in a fuse block.

With the increase in storage capacity of a semiconductor apparatus, the number of fuses included in the fuse block may increase.

In case the fuse block has a large number of fuses, the repair information stored in the fuse block may be read and stored in a separate fuse latch array in advance ("boot-up operation") to reduce the amount of time that is taken to read out the repair information.

However, the current consumed by the boot-up operation may increase the current consumption of the semiconductor apparatus.

SUMMARY

Various embodiments are directed to a repair information storage circuit capable of reducing current consumption and a semiconductor apparatus including the same.

In an embodiment of the present disclosure, a repair information storage circuit may include: a controller configured to generate a voltage control signal in response to a boot-up enable signal provided from a fuse block; and a fuse latch array configured to store repair information provided from the fuse block, and having a threshold voltage adjusted according to the voltage control signal.

In an embodiment of the present disclosure, a semiconductor apparatus may include: a memory block including a plurality of unit memory blocks; a fuse block configured to store address information for accessing a defective memory cell among memory cells of the memory block as repair information, and output the repair information during a boot-up operation period of the semiconductor apparatus; and a repair information storage circuit configured to store the repair information in one or more fuse latch arrays during the boot-up operation period, and differently adjust the threshold voltage of the fuse latch array for the boot-up operation period and a normal operation period.

BRIEF DESCRIPTION OF THE DRAWINGS

Features, aspects, and embodiments are described in conjunction with the attached drawings, in which.

DETAILED DESCRIPTION

Figure 1:
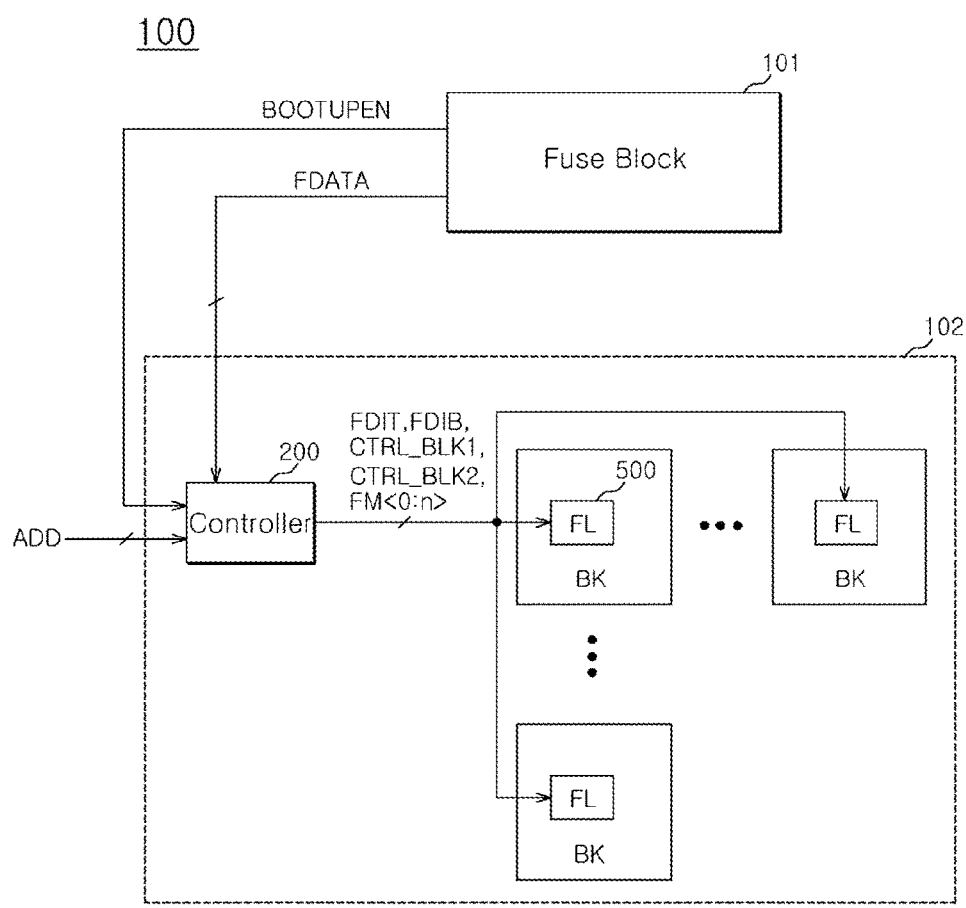
FIG. 1 is a block diagram of a semiconductor apparatus 100 according to an embodiment of the present disclosure.

An example of a semiconductor apparatus in accordance with an embodiment of the present disclosure is shown in FIG. 1.

As illustrated in FIG. 1, a semiconductor apparatus 100 according to an embodiment of the present disclosure may include a repair information storage circuit and a memory block 102.

The memory block 102 may include a plurality of unit memory blocks, for example, a plurality of memory banks BK.

The repair information storage circuit may include a fuse block 101, a controller 200, and a plurality of fuse latches 500.

The fuse block 101 may include a plurality of fuses therein. In an embodiment of the present invention, fuse block 101 may include electronic fuses ("E-fuses").

When the semiconductor apparatus enters a boot-up mode during an initialization process, the fuse block 101 may output a boot-up enable signal BOOTUPEN and repair information FDATA.

The boot-up mode may include an operation mode in which the repaired information FDATA stored in the fuse block 101 is read in advance and stored in a separate fuse latch array 500 adjacent to the memory block 102.

The controller 200 may generate first and second voltage control signals CTRL_BLK<1:2> in response to the boot-up enable signal BOOTUPEN.

When the semiconductor apparatus 100 is not in an active period of the boot-up enable signal BOOTUPEN (e.g., when the semiconductor apparatus 100 is a normal operation period), the controller 200 may generate the first and second voltage control signals CTRL_BLK<1:2> to make threshold voltages of fuse latches included the fuse latch arrays 500 higher than the threshold voltages in an active period of the boot-up enable signal BOOTUPEN.

The controller 200 may generate first and second fuse signals FDIT and FDIB and a plurality of fuse latch select signals FM<0:n> in response to the repair information FDATA and an address signal ADD.

Each memory bank BK may have its own fuse latch array 500. In an embodiment of the present invention, the plurality of fuse latch arrays 500 may be disposed on areas where the respective memory banks BK are located.

The plurality of fuse latch arrays 500 may be selectively enabled to store the first and second fuse signals FDIT and FDIB according to the plurality of fuse latch select signals FM<0:n>, and the threshold voltages thereof may be adjusted according to the first and second voltage control signals CTRL_BLK<1:2>.

Figure 2:
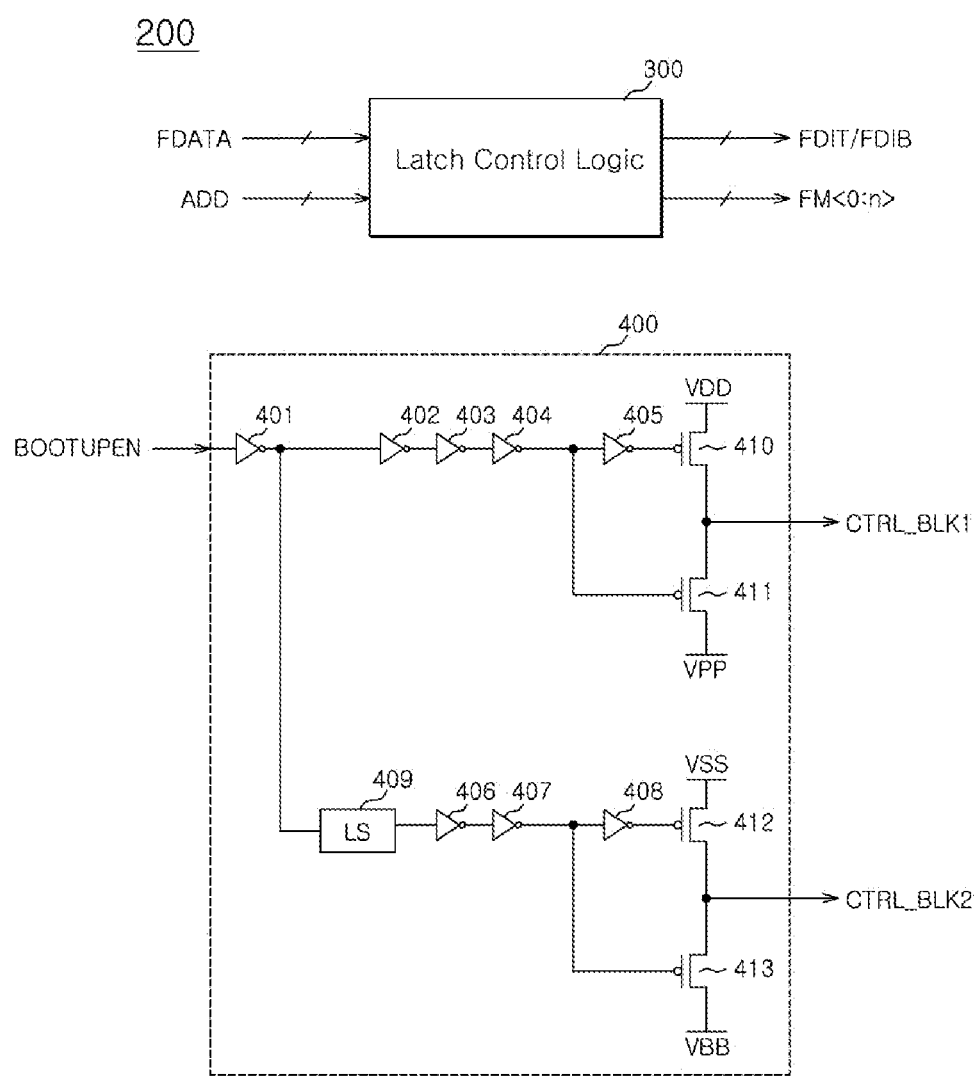
FIG. 2 is a diagram illustrating the internal configuration of a controller 200 of FIG. 1.

As illustrated in FIG. 2, the controller 200 may include a latch control logic 300 and a voltage control unit 400.

The latch control logic 300 may generate first and second fuse signals FDIT and FDIB by using the repair information FDATA. The first and second fuse signals FDIT and FDIB may be differential signals suitable for being stored in the fuse latch array 500.

The latch control logic 300 may generate the first fuse signal FDIT having the same logic level as the repair information FDATA and the second fuse signal FDIB having the opposite logic level to the first fuse signal FDIT.

The latch control logic 300 may generate the plurality of fuse latch select signals FM<0:n> for selectively enabling the fuse latches of the fuse latch array 500 in response to the address signal ADD.

An address signal ADD may include row address signals corresponding to the plurality of memory banks BK.

The voltage control unit 400 may generate the first and second voltage control signals CTRL_BLK<1:2> in response to the boot-up enable signal BOOTUPEN.

When the semiconductor apparatus 100 is not in an active period of the boot-up enable signal BOOTUPEN (e.g., when the semiconductor apparatus 100 is a normal operation period), the voltage control unit 400 may generate the first and second voltage control signals CTRL_BLK<1:2> to make the threshold voltages of the fuse latches included in each of the fuse latch arrays 500 higher than the threshold voltages in an active period of the boot-up enable signal BOOTUPEN.

The voltage control unit 400 may include first to eighth inverters 401 to 408, a level shifter 409, and first to fourth transistors 410 to 413.

The boot-up enable signal BOOTUPEN may be transmitted through the first to fifth inverters 401 to 405.

The level shifter 409 may shift an output of the first inverter 401 to a level of a bulk bias voltage VBB.

The output of the level shifter 409 may be transmitted though the sixth to eighth inverters 406 to 408.

The first transistor 410 may output a first voltage level as the first voltage control signal CTRL_BLK1 according to an output of the fifth inverter 405.

A power supply voltage VDD may be used as the first voltage.

The second transistor 411 may output a second voltage level as the first voltage control signal CTRL_BLK1 according to an output of the fourth inverter 404.

A first pumping voltage VPP having a higher level than the power supply voltage VDD may be used as the second voltage.

The third transistor 412 may output a third voltage level as the second voltage control signal CTRL_BLK2 according to an output of the eighth inverter 408.

A ground voltage VSS may be used as the third voltage.

The fourth transistor 413 may output a fourth voltage level as the second voltage control signal CTRL_BLK2 according to an output of the seventh inverter 407.

A second pumping voltage VBB having a lower voltage level than the ground voltage VSS (e.g., a negative voltage level) may be used as the fourth voltage.

Figure 3:
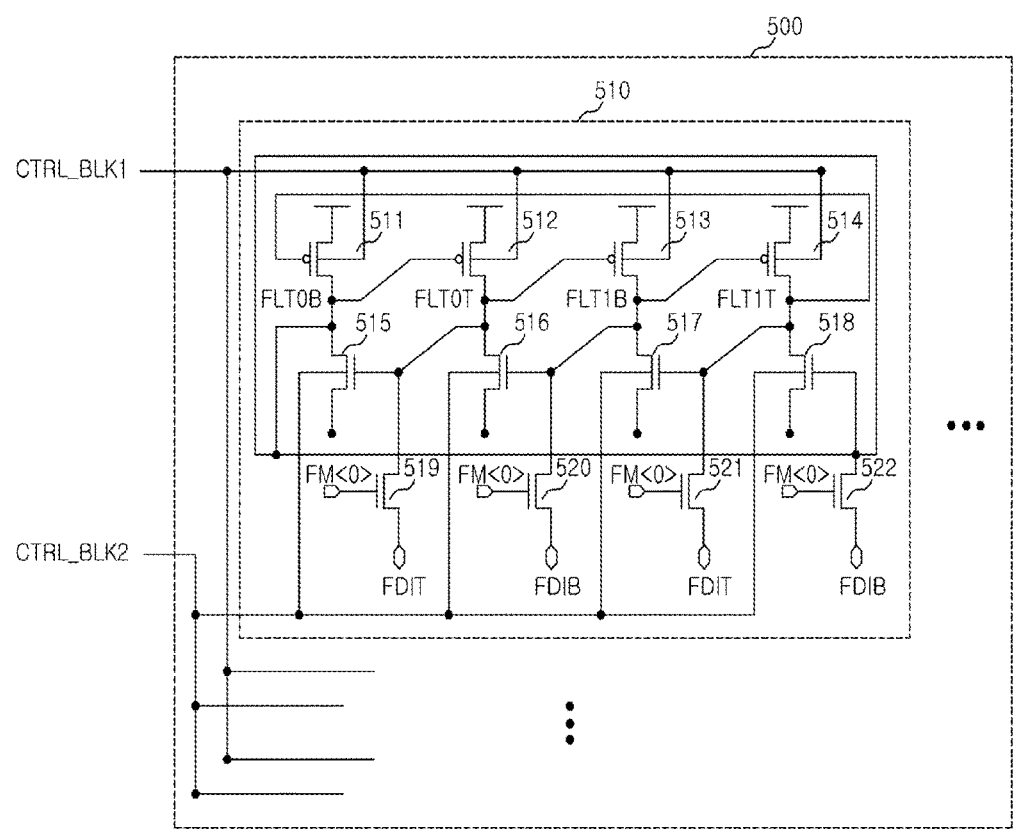
FIG. 3 is a circuit diagram of a fuse latch array 500 of FIG. 1.

As illustrated in FIG. 3, the fuse latch array 500 may include a plurality of fuse latch units 510.

A dual interlock storage cell ("DICE") latch may be used as the fuse latch unit 510.

The DICE latch has a structure that stores the first and second fuse signals FDIT and FDIB, which are complementary signals.

The fuse latch unit 510 may include first to third transistor groups.

The first transistor group may include first to fourth transistors 511 to 514. The first to fourth transistors 511 to 514 may be PMOS transistors.

The second transistor group may include fifth to eighth transistors 515 to 518. The fifth to eighth transistors 515 to 518 may be NMOS transistors.

The third transistor group may include ninth to twelfth transistors 519 to 522. The ninth to twelfth transistors 519 to 522 may be NMOS transistors.

The first to fourth transistors 511 to 514 may be coupled to the fifth to eighth transistors 515 to 518. In case where the first to fourth transistors 511 to 514 are PMOS transistors and the fifth to eighth transistors 515 to 518 are NMOS transistors, drain terminals of the first to fourth transistors 511 to 514 may be coupled to drain terminals of the fifth to eighth transistors 515 to 518, respectively. The first and second fuse signals FDIT and FDIB may be stored in first, second, third, and fourth nodes FLT0B, FLT0T, FLT1B, and FLT1T.

The first voltage control signal CTRL_BLK1 may be used as a bulk bias that is applied to bulk terminals of the first to fourth transistors 511 to 514.

An increase in the bulk bias level of the PMOS transistor may decrease leakage current at the PMOS transistor.

The second voltage control signal CTRL_BLK2 may be used as a bulk bias that is applied to bulk terminals of the fifth to eighth transistors 515 to 518.

An increase in the bulk bias level of the NMOS transistor may decrease leakage current at the NMOS transistor.

The ninth to twelfth transistors 519 to 522 may be enabled in response to the fuse latch select signals FM<0:n>. In an embodiment of the present invention, the ninth to twelfth transistors 519 to 522 may output the first and second fuse signals FDIT and FDIB to the first, second, third, and fourth nodes FLT0B, FLT0T, FLT1B, and FLT1T in response to one of the fuse latch select signals FM<0:n> (e.g., FM<O>).

Figure 4:
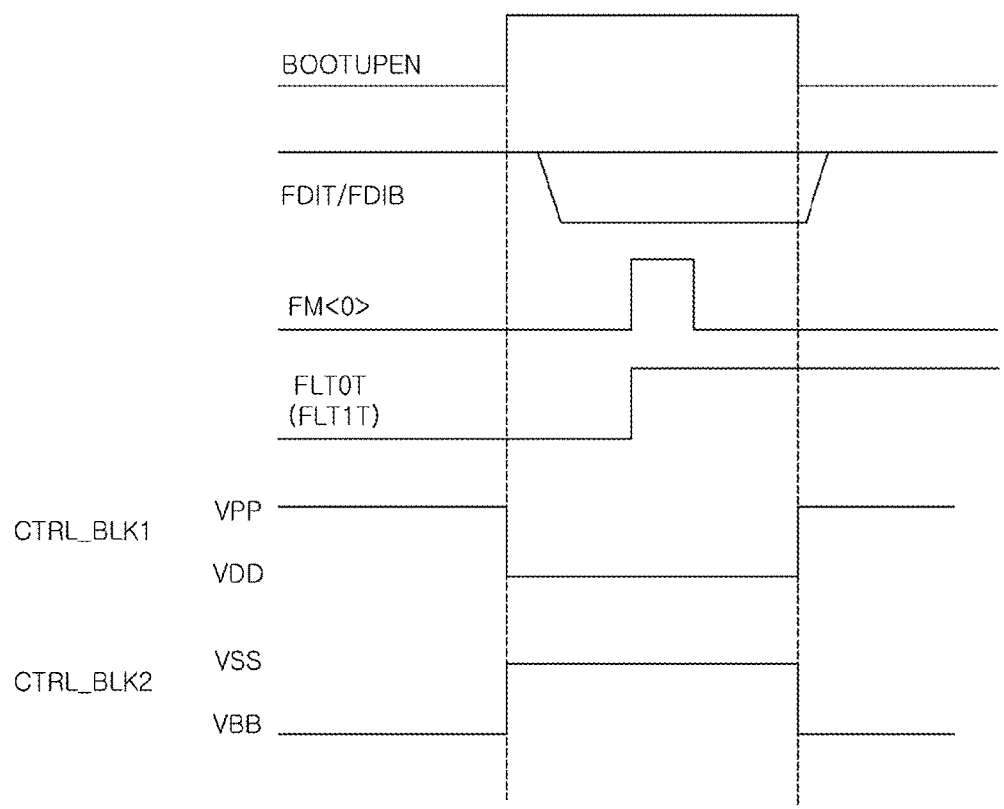
FIG. 4 is a timing diagram for describing a boot-up operation of the semiconductor apparatus 100 according to an embodiment of the present disclosure.

Referring to FIG. 4, the boot-up operation of the semiconductor apparatus according to the embodiment of the present disclosure will be described as follows.

During the boot-up operation of the semiconductor apparatus 100, the fuse block 101 may activate the boot-up enable signal BOOTUPEN to a logic high level and also provide the repair information FDATA to the controller 200.

The fuse block 101 may provide the repair information FDATA to the controller 200 after activating the boot-up enable signal BOOTUPEN to a logic high level.

The first and second fuse signals FDIT and FDIB which are generated according to the repair information FDATA may be stored in the fuse latch arrays 500 of the plurality of memory banks BK, respectively.

FIG. 3 shows an example in which the first fuse signal FDIT and the second fuse signal FDIB generated according to one signal bit of the repair information FDATA are stored in the fuse latch unit 510.

The controller 200 may generate the first and second fuse signals FDIT and FDIB using the repair information FDATA, and provide the first and second fuse signals FDIT and FDIB to the fuse latch array 500.

For example, the controller 200 may generate the first fuse signal FDIT having a logic high level and the second fuse signal FDIB having a logic low level.

During the boot-up operation period in which the boot-up enable signal BOOTUPEN is at a logic high level, the controller 200 may activate the fuse latch select signal FM<0> among the plurality of fuse latch select signals FM<0:n> to a logic high level for a predetermined time according to the address signal ADD.

The ninth to twelfth transistors 519 to 522 of the fuse latch unit 510 may be turned on in response to the fuse latch select signal FM<0> having the logic high level.

During the boot-up operation period in which the boot-up enable signal BOOTUPEN is at a logic high level, the first voltage control signal CTRL_BLK1 may be maintained at the level of the power supply voltage VDD, and the second voltage control signal CTRL_BLK2 may be maintained at the level of the ground voltage VSS.

When the fuse latch select signal FM<0> is activated to the logic high level, the first and second fuse signals FDIT and FDIB may be stored in the fuse latch unit 510.

The second and fourth nodes FLT0T and FLT1T of the fuse latch unit 510 may store a logic high value, and the first and third nodes FLT0B and FLT1B of the fuse latch unit 510 may store a logic low value.

The boot-up enable signal BOOTUPEN may be deactivated to a logic low level after the boot-up operation period ends, and then the semiconductor apparatus enters a normal operation period.

The ninth to twelfth transistors 519 to 522 of the fuse latch unit 510 may be turned off after the fuse latch select signal FM<0> was deactivated to a logic low level.

During the normal operation period in which the boot-up enable signal BOOTUPEN is at a logic low level, the first voltage control signal CTRL_BLK1 may be maintained at the level of the first pumping voltage VPP, and the second voltage control signal CTRL_BLK2 may be maintained at the level of the second pumping voltage VBB.

When the first voltage control signal CTRL_BLK1, which is used as a bulk bias of the first to fourth transistors 511 to 514, has the level of the first pumping voltage VPP, the first to fourth transistors 511 to 514 may have lower leakage current than when the first voltage control signal CTRL_BLK1 has the level of the power supply voltage VDD.

When the second voltage control signal CTRL_BLK2, which is used as a bulk bias of the fifth to eighth transistors 515 to 518, has the level of the second pumping voltage VBB, the fifth to eighth transistors 515 to 518 may have lower leakage current than when the second voltage control signal CTRL_BLK2 has the level of the ground voltage VSS.

In an embodiment of the present invention, the bulk bias for the first to eighth transistors 511 to 518 may vary depending on whether the semiconductor apparatus is in the boot-up mode or not. For example, during the boot-up mode, the first to fourth transistors 511 to 514 have the power supply voltage VDD as their bulk bias and the fifth to eighth transistors 515 to 518 have the ground voltage VSS as their bulk bias. Whereas, during the normal operation period, the first to fourth transistors 511 to 514 have the first pumping voltage VPP as their bulk bias and the fifth to eighth transistors 515 to 518 have the second pumping voltage VBB as their bulk bias, and therefore the first to eighth transistors 511 to 518 may reduce leakage current when the semiconductor apparatus is not in the boot-up mode.

While certain embodiments have been described above, it will be understood to those skilled in the art that the embodiments described are by way of example only. Accordingly, the semiconductor apparatus described herein should not be limited based on the described embodiments. Rather, the semiconductor apparatus described herein should only be limited in light of the claims that follow when taken in conjunction with the above description and accompanying drawings.

What is claimed is:

1. A repair information storage circuit comprising:
    a controller configured to generate a voltage control signal in response to a boot-up enable signal; and
    a fuse latch array configured to store a repair information,
    wherein a threshold voltage of a transistor formed in the fuse latch array is adjusted according to the voltage control signal, and
    wherein the voltage control signal generated when the boot-up enable signal is not activated is different from the voltage control signal generated when the boot-up enable signal is activated.

2. The repair information storage circuit according to claim 1, wherein the repair information comprises address information of a defective memory cell among memory cells included in a memory block of a semiconductor apparatus.

3. The repair information storage circuit according to claim 1, wherein the fuse latch array comprises a plurality of fuse latch units, and each of the fuse latch units comprises the transistor configured to receive the voltage control signal as a bulk bias.

4. The repair information storage circuit according to claim 1, wherein, when the boot-up enable signal is not activated, the controller generates the voltage control signal having a first pumping voltage, which is higher than a power supply voltage, for PMOS transistors of the fuse latch array, and generates the voltage control signal having a second pumping voltage, which is lower than ground voltage, for NMOS transistors of the fuse latch array.

5. The repair information storage circuit according to claim 1, wherein the controller is configured to generate a fuse latch select signal, a first fuse signal, and a second fuse signal in response to an address signal and the repair information.

6. The repair information storage circuit according to claim 5, wherein the fuse latch array comprises a plurality of latch units which are selectively enabled according to the fuse latch select signal and store the first and second fuse signals.

7. The repair information storage circuit according to claim 1, wherein the voltage control signal comprises first and second voltage control signals, and wherein the controller comprises:
    a latch control logic configured to generate a first fuse signal having the same logic level as the repair information and a second fuse signal having the opposite logic level to the first fuse signal, and generate a fuse latch select signal in response to an address signal; and
    a voltage control unit configured to generate the first and second voltage control signals in response to the boot-up enable signal.

8. The repair information storage circuit according to claim 7, wherein the fuse latch array comprises a plurality of fuse latch units, and
    each of the fuse latch units comprises:
    a first transistor group configured to receive the first voltage control signal through a bulk terminal thereof;
    a second transistor group configured to receive the second voltage control signal through a bulk terminal thereof; and a third transistor group configured to be selectively enabled according to the fuse latch select signal, and provide the first and second fuse signals to nodes where the first transistor group is coupled to the second transistor group.

9. The repair information storage circuit according to claim 8, wherein, when the boot-up enable signal is not activated, the controller adjusts the voltage level of the first voltage control signal to a higher level than when the boot-up enable signal is activated, and adjusts the voltage level of the second voltage control signal to a lower level than when the boot-up enable signal is activated.

10. A semiconductor apparatus comprising:
a memory block comprising a plurality of unit memory blocks;
a fuse block configured to store address information of a defective memory cell among memory cells of the memory block as repair information, and output the repair information during a boot-up operation period of the semiconductor apparatus; and
a repair information storage circuit configured to store the repair information in one or more fuse latch arrays during the boot-up operation period, and adjust threshold voltage of a transistor formed in the fuse latch array so that the threshold voltage when the boot-up enable signal is activated is different from the threshold voltage when the boot-up enable signal is not activated.

11. The semiconductor apparatus according to claim 10, wherein the one or more fuse latch arrays are configured in each of the unit memory blocks.

12. The semiconductor apparatus according to claim 10, wherein the repair information storage circuit comprises:
a controller configured to generate a voltage control signal in response to a boot-up enable signal provided from the fuse block; and
the fuse latch array configured to store the repair information provided from the fuse block.

13. The semiconductor apparatus according to claim 12, wherein the fuse latch array comprises a plurality of fuse latch units, and each of the fuse latch units comprises a plurality of transistors configured to receive the voltage control signal through bulk terminals thereof.

14. The semiconductor apparatus according to claim 12, wherein, when the boot-up enable signal is not activated, the controller generates the voltage control signal having a first pumping voltage, which is higher than a power supply voltage, for PMOS transistors of the fuse latch array, and generates the voltage control signal having a second pumping voltage, which is lower than ground voltage, for NMOS transistors of the fuse latch array.

15. The semiconductor apparatus according to claim 12, wherein the controller is configured to generate a fuse latch select signal, a first fuse signal, and a second fuse signal in response to an address signal and the repair information.

16. The semiconductor apparatus according to claim 15, wherein the fuse latch array comprises a plurality of fuse latch units which are selectively enabled according to the fuse latch select signal and store the first and second fuse signals.

17. The semiconductor apparatus according to claim 12, wherein the voltage control signal comprises first and second voltage control signals, and wherein the controller comprises:
a latch control logic configured to generate a first fuse signal having the same logic level as the repair information and a second fuse signal having the opposite logic level to the first fuse signal, and generate a fuse latch select signal in response to an address signal; and
a voltage control unit configured to generate the first and second voltage control signals in response to the boot-up enable signal.

18. The semiconductor apparatus according to claim 17, wherein the fuse latch array comprises a plurality of fuse latch units, and
each of the fuse latch units comprises:
a first transistor group configured to receive the first voltage control signal through a bulk terminal thereof;
a second transistor group configured to receive the second voltage control signal through a bulk terminal thereof; and
a third transistor group configured to be selectively enabled according to the fuse latch select signal, and provide the first and second fuse signals to nodes where the first transistor group is coupled to the second transistor group.

19. The semiconductor apparatus according to claim 18, wherein, when the boot-up enable signal is not activated, the controller adjusts the voltage level of the first voltage control signal to a higher level than when the boot-up enable signal is activated, and adjusts the voltage level of the second voltage control signal to a lower level than when the boot-up enable signal is activated.

* * * * *